United States Patent
Miller

(10) Patent No.: US 7,520,969 B2
(45) Date of Patent: Apr. 21, 2009

(54) NOTCHED DEPOSITION RING

(75) Inventor: Keith A. Miller, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 408 days.

(21) Appl. No.: 11/369,884

(22) Filed: Mar. 7, 2006

(65) Prior Publication Data

US 2007/0209931 A1    Sep. 13, 2007

(51) Int. Cl.
*C23C 14/35* (2006.01)
*C23C 16/00* (2006.01)

(52) U.S. Cl. ............ 204/298.11; 204/298.15; 118/720; 118/728; 156/345.3; 156/345.51; 156/345.54

(58) Field of Classification Search ............ 204/298.11, 204/298.15; 118/720, 728; 156/345.3, 345.51, 156/345.54
See application file for complete search history.

(56) References Cited

U.S. PATENT DOCUMENTS

| | | | |
|---|---|---|---|
| 5,262,029 A | 11/1993 | Erskine et al. | |
| 5,280,156 A | 1/1994 | Niori et al. | |
| 5,447,570 A | 9/1995 | Schmitz et al. | |
| 5,803,977 A | 9/1998 | Tepman et al. | |
| 6,039,836 A * | 3/2000 | Dhindsa et al. | 156/345.1 |
| 6,051,122 A | 4/2000 | Flanigan | |
| 6,797,131 B2 * | 9/2004 | Liu et al. | 204/192.38 |

OTHER PUBLICATIONS

International Search Report and Written Opinion for PCT/US07/63353, Jul. 2, 2008, copy consists of 13 unnumbered pages.

* cited by examiner

*Primary Examiner*—Rodney G McDonald
(74) *Attorney, Agent, or Firm*—Patterson & Sheridan, LLP

(57) ABSTRACT

A process kit for a semiconductor processing chamber is provided. In one embodiment, a process kit includes a notched deposition ring. In another embodiment, a process kit includes a cover ring configured to engage the notched deposition ring. In another embodiment, a process kit includes an annular deposition ring body having inner, outer, upper and bottom walls. A trough is recessed into an upper surface of the body between the upper and inner walls. A recessed surface is formed on a lower surface of the body between the bottom and inner walls. A notch extends inward from the body to catch deposition material passing through a notch of the substrate being processed.

23 Claims, 5 Drawing Sheets

NOTCHED DEPOSITION RING

BACKGROUND OF THE INVENTION

1. Field of the Invention

Embodiments of the invention generally relate to process kit for a semiconductor processing chamber, and more specifically, to a notched deposition ring.

2. Description of the Related Art

In deposition processes, species from a source such as a target, a gas inlet manifold and the like, may deposit on exposed internal chamber surfaces, including chamber walls, substrate pedestal assemblies, electrostatic chucks and other hardware. Process kits, such as shield assemblies, have been developed that circumscribe the electrostatic chuck within a semiconductor processing system to protect the chuck from exposure to the deposition species within the system. One shield assembly includes a removable cover ring and a deposition ring.

The deposition ring rests upon a circumferential flange extending from an outer edge of the electrostatic chuck. The support surface of the chuck, upon which a substrate is retained, has a diameter that is slightly smaller than the diameter of a substrate. Consequently, a substrate retained by the chuck overhangs an inner portion of the top surface of the deposition ring. The cover ring circumscribes and rests upon an outer portion of the deposition ring. The cover ring has a lip that overhangs the outer portion but does not contact a top surface of the deposition ring, thereby defining a labyrinth gap between the cover and deposition rings. The labyrinth gap separating the rings prevents deposition species from passing between the space and into contact with the electrostatic chuck.

Although shield assemblies having the above-described configuration have demonstrated robust performance, improvements are desired that reduce the potential for particular generation within the chamber and/or enhance longer production runs between replacement of the rings for cleaning. For example, deposition build-up on the rings may lead to undesirable electrical bridging between the rings that adversely affect process performance, thereby requiring periodic ring replacement for cleaning. Deposition build-up is particularly problematic below the substrate notch, which exposes the underlying deposition ring to a greater flux of deposition species relative to the surrounding area of the ring.

Therefore, there is a need for an improved process kit.

SUMMARY OF THE INVENTION

A process kit for a semiconductor processing chamber is provided. In one embodiment, a process kit includes a notched deposition ring. In another embodiment, a process kit includes a cover ring configured to engage the notched deposition ring.

In another embodiment, a process kit includes an annular deposition ring body having inner, outer, upper and bottom walls. A trough is recessed into an upper surface of the body between the upper and inner walls. A recessed surface is formed on a lower surface of the body between the bottom and inner walls. A notch is formed in the body to accommodate a build-up of deposition material on the area of the deposition ring configured to support a cover ring.

In another embodiment, a process kit includes an annular deposition ring body having an upper wall forming a portion of an upper surface of the body, a lower wall forming a portion of a lower surface of the body, an inner wall and an outer wall. A recessed portion has a diameter greater than the inner wall and is disposed adjacent the inner wall. An upper outer wall has a diameter less than the outer wall and is disposed adjacent to the outer wall. A land substantially perpendicular to a centerline of the body is formed between the outer and upper outer walls. A notch is formed in the body between the outer and upper outer walls. A trough is recessed into the upper surface of the body between the upper and inner walls. A sloped portion extends upwards from the trough to an inner edge of the upper surface. A tab extends from the inner edge of the upper surface. A recessed surface is formed on the lower surface of the body between the bottom and inner walls. A coating is applied to at least the upper wall and the trough of the body to which tantalum and/or tantalum nitride adheres preferentially relative to a surface of the land.

DESCRIPTION OF THE DRAWINGS

A more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The invention generally provides a process kit for using in a semiconductor processing chamber. The process kit advantageously includes a deposition ring having at least one feature that promotes longer surface life and/or process uniformity. Although the invention is disclosed and illustrated in a physical vapor deposition (PVD) chamber, the disclosure is one of illustration, and accordingly, the invention finds utility in other semiconductor processing chambers, including chemical vapor deposition chambers, among others.

Figure 1:
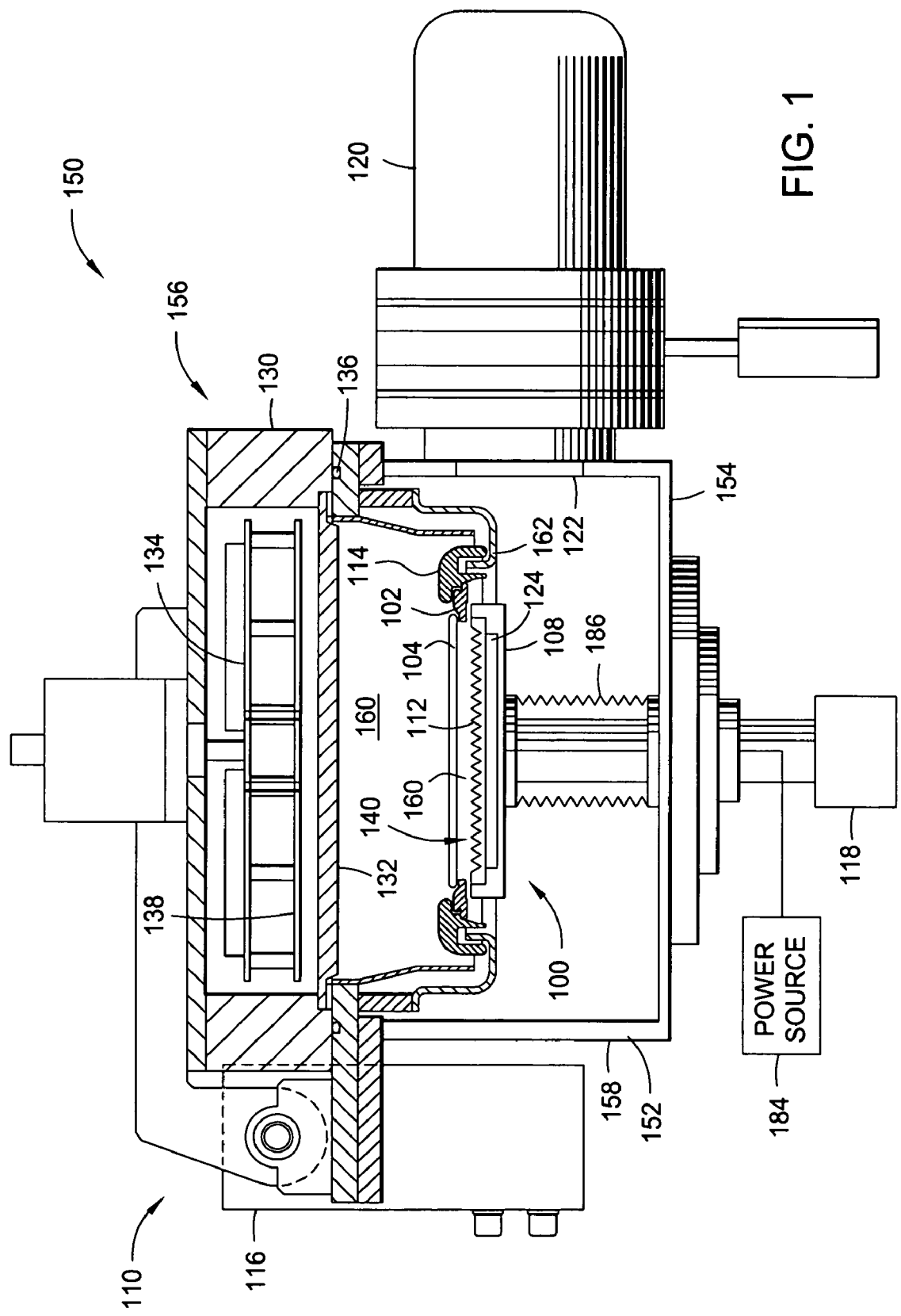
FIG. 1 is a simplified sectional view of a semiconductor processing system having one embodiment of a notched deposition ring disposed on a substrate support.

FIG. 1 depicts one embodiment of a semiconductor processing chamber 150. One example of a processing chamber that may be adapted to benefit from the invention is an IMP VECTRA™ PVD processing chamber, available from Applied Materials, Inc., of Santa Clara, Calif.

The exemplary processing chamber 150 includes a chamber body 152 having a bottom 154, lid assembly 156 and sidewalls 158 that define an evacuable interior volume 160. The chamber body 150 is typically fabricated from welded plates of stainless steel or a unitary block of aluminum. The sidewalls 158 generally contain a sealable access port (not shown) to provide for entrance and egress of a substrate 104 from the processing chamber 150. A pumping port 122 disposed in the sidewalls 158 is coupled to a pumping system 120 that exhausts and controls the pressure of the interior volume 160. The lid assembly 156 of the chamber 150 generally supports an annular shield 162 suspended therefrom that supports a cover ring 114. The cover ring 114 is generally configured to confine deposition to a portion of the substrate 104 exposed through the center of the cover ring 114.

A pedestal assembly 100 is supported from the bottom 154 of the chamber 150. The pedestal assembly 100 supports a deposition ring 102 along with the substrate 104 during processing. The pedestal assembly 100 is coupled to the bottom 154 of the chamber 150 by a lift mechanism 118 that is configured to move the pedestal assembly 100 between an upper (as shown) and lower position. In the upper position, the pedestal assembly 100 engages the cover ring 114, lifting the cover ring 114 from the shield 162 as the pedestal assembly 100 moves the substrate 104 upwards to a processing position.

In the lower position, the pedestal assembly 100 is positioned below the shield 162 to allow the substrate 104 to be removed from the chamber 150 through the access port disposed in the sidewall 158. The shield 162 re-engages the cover ring 114 so that the ring 114 becomes suspended above the pedestal assembly 100 and substrate 104, as the pedestal assembly 100 moves to the lower position to facilitate substrate transfer below the shield 162. Additionally, in the lower position, lift pins (not shown) are moved through the pedestal assembly 100 to space the substrate 104 from the pedestal assembly 100 to facilitate securing of the substrate 104 by a wafer transfer mechanism disposed exterior to the processing chamber 150 such as a single blade robot (not shown). A bellows 186 is typically disposed between the pedestal assembly 100 and the chamber bottom 154 to isolate the interior volume 160 of the chamber body 152 from the interior of the pedestal assembly 100.

The pedestal assembly 100 generally includes a substrate support 140 sealingly coupled to a platform housing 108. The platform housing 108 is typically fabricated from a metallic material such as stainless steel or aluminum. A cooling plate 124 is generally disposed within the platform housing 108 to thermally regulate the substrate support 140. One pedestal assembly 100 that may be adapted to benefit from the invention is described in U.S. Pat. No. 5,507,499, issued Apr. 16, 1996 to Davenport et al., which is incorporated herein by reference in its entirety.

The substrate support 140 is typically comprised of ceramic and may be an electrostatic chuck, a ceramic body, a heater or a combination thereof. In one embodiment, the substrate support 140 is an electrostatic chuck that includes a dielectric body 106 having a conductive layer 112 embedded therein. The dielectric body 106 is typically fabricated from a high thermal conductivity dielectric material such as pyrolytic boron nitride, aluminum nitride, silicon nitride, alumina or an equivalent material.

The lid assembly 156 generally includes a lid 130, a target 132 and a magnetron 134. The lid 130 is supported by the sidewalls 158 when in a closed position as shown in FIG. 1. A seal 136 is disposed between the lid 130 and sidewalls 158 to prevent vacuum leakage therebetween.

The target 132 is coupled to the lid 130 and exposed to the interior volume 160 of the processing chamber 150. The target 132 provides material which is deposited on the substrate 104 during a PVD process. The target 132 and pedestal assembly 100 are biased relative each other by a power source 184. A gas such as argon is supplied to the volume 160 from a gas source (not shown). A plasma is formed between the substrate 104 and the target 132 from the gas. Ions within the plasma are accelerated toward the target 132 and cause material to become dislodged from the target 132. The dislodged target material is deposited on the substrate 104.

The magnetron 134 is coupled to the lid 130 on the exterior of the processing chamber 150. The magnetron 134 includes at least one rotating magnet assembly 138 that promotes uniform consumption of the target 132 during the PVD process. One magnetron which may be utilized is described in U.S. Pat. No. 5,953,827, issued Sep. 21, 1999 to Or et al., which is hereby incorporated by reference in its entirety.

A hinge assembly 110 couples the lid assembly 156 to the processing chamber 150. A motorized actuator 116 may be coupled to the hinge assembly 110 and/or lid 130 to facilitate movement of the lid assembly 156 between an open and closed portion.

A deposition ring 102 is supported by the pedestal assembly 100 and circumscribes the substrate 104 to protect the substrate support 140 during processing. The deposition ring 102 is configured to engage the cover ring 114 as the pedestal assembly 100 is raised and lift the cover ring 114 from the shield 162.

Figure 2:
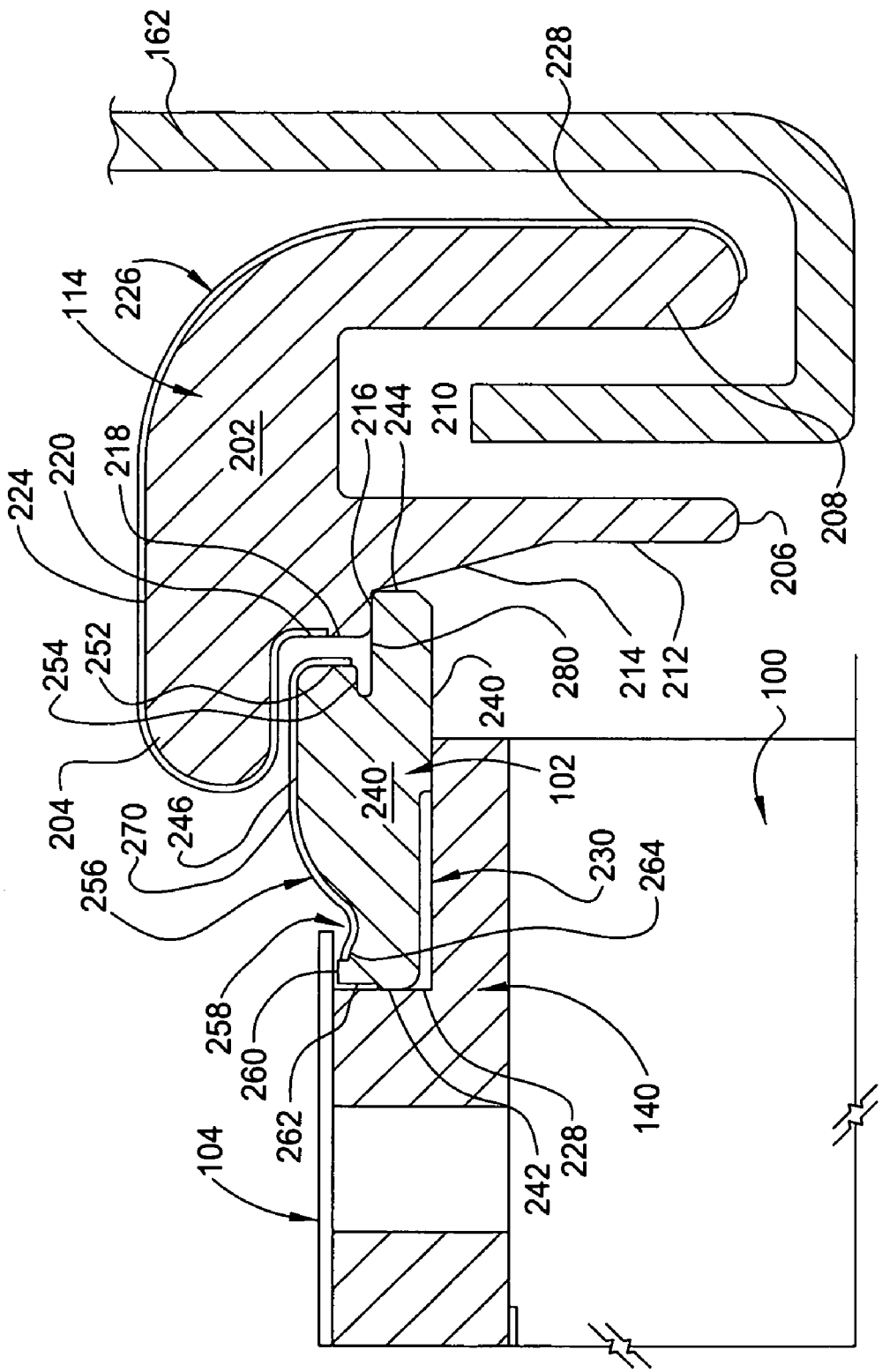
FIG. 2 is a partial sectional view of the notched deposition ring disposed on the substrate support.

FIG. 2 is a partial sectional view of the processing system 150 illustrating a portion of the substrate support 140, the deposition ring 102 and the cover ring 114. The cover ring 114 generally has an annular body 202. The body 202 may be fabricated from a metal such as stainless steel, aluminum oxide, titanium or other suitable material. The body 202 generally includes a lip 204 that extends radially inward and provides an upper boundary of a labyrinth gap defined between the deposition ring 102 and the cover ring 114.

The body 202 of the cover ring 114 also includes an inner ring 206 and an outer ring 208. The rings 206, 208 extend downward from the body 202 in a spaced apart relation that defined a slot 210. The slot 210 has an open end facing downward to allow engagement with the end of the shield 162.

A tapered section 214 is defined on the upper section of an inner wall 212 of the inner ring 206. The tapered section 214 extends gradually inward from the inner wall 212 and terminates at a ledge 216 formed on a lower surface of the body 202. The tapered section 214 allows the cover ring 114 and deposition ring 102 to self-align as the rings come into contact with each other.

The ledge 216 is generally horizontal and perpendicular to the centerline of the cover ring 114. The ledge 216 provides a bearing surface of the cover ring 114 which is supported by the deposition ring 102. The ledge 216 is generally smooth and planar to allow the ledge 216 to slide along the deposition ring 102, if necessary, with minimal particle generation.

The inside edge of the ledge 216 terminates in a wall 218. The wall 218 is substantially vertical and extends between the ledge 216 and the lip 204. The wall 218 is radially inward of the inner ring 206, and radially outward of the lip 202. The wall 218 forms part of the labyrinth gap boundary.

In one embodiment, the cover ring 114 may be fabricated from or coated with a material selected to enhance adhesion of deposition materials to the cover ring 114. In one embodiment of a ring configured for use in a tantalum nitride deposition system, the cover ring 114 is coated with an arc spray. The arc spray may be a coating such as TWAS or an aluminum twin wire arc spray, among others. Another suitable coating is available from Applied Materials, Inc., marketed under the trade name CleanCoat™. The coating may be selectively deposited on regions of the cover ring 114 exposed to deposition species during processing. As the arc spray and/or deposition material adhering thereon may be conductive, the coating 226 may be selectively applied to regions of the cover ring 114 that have sufficient spacing with the deposition ring 102 to prevent shorting even after a significant amount of the deposited material has adhered to the coating 226. In the embodiment depicted in FIG. 2, the coating 226 is selectively applied to an upper region 220 of the wall 218 proximate the lip 204, the lip 204, a top 224 of the body 202 and an outside wall 228 of the outer ring 208. The portion of the cover ring 214 that may be in contact with or close proximity to the deposition ring 102, such as the ledge 216 and the tapered section 214 of the inner wall 212, are not coated.

The deposition ring 102 generally comprises an annular body 240. The body 240 may be fabricated from a ceramic material, such as quartz, aluminum oxide or other suitable material. The body 240 generally includes an inner wall 242, an outer wall 244, a lower wall 248 and an upper wall 246. The inner and outer walls 242, 244 respectively define the innermost and outermost diameters of the body 240. The upper and lower walls 246, 248 define the uppermost and lowermost surfaces of the body 240.

The lower wall 248 is configured to support the deposition ring 102 on a flange 230 of the substrate support 140. The lower wall 248 is generally perpendicular to a centerline of the deposition ring 102 to maintain perpendicularity with the flange 230 of the substrate support 140 and parallelism with the substrate 104. The lower wall 248 is planar and smooth to facilitate movement of the deposition ring 102 on the flange 230 due to thermal expansion and/or contraction of the ring 102 relative to the pedestal assembly 100.

The lower surface of the body 240 includes a recessed portion 250 formed between the lower wall 248 and the inner wall 242. The recessed portion 250 minimizes the contact area between the flange 230 of the substrate support 140 and the deposition ring 102. The reduced contact area between the deposition ring 102 and the substrate support 140 reduces friction while minimizing particle generation as the deposition ring 102 moves on the flange 230 of the substrate support 140.

An upper inner wall 262 is also recessed from the inner wall 242. The upper inner wall 262 minimizes the contact area between the body 240 and the wall 228 of the pedestal assembly 100 if the deposition ring 102 inadvertently contacts the substrate support.

The upper surface of the body 240 includes a trough 258 formed radially inward of the upper wall 246. The trough 258 is coupled to the upper wall 246 by a sloped region 256. The thickness of the body 240 increases radially inward of the trough 258, as the upper surface of the body 240 slopes upward to form an inner edge 260 of the upper surface. The inner edge 260 is generally at a higher elevation than the trough 258 relative to the lower wall 248, and at a lower elevation relative to the upper wall 246. The trough 258 provides a collection area removed from the ring contact area so that materials deposited on the deposition ring 102 do not contact the substrate or inhibit movement of the rings. Additionally, the inwardly and upwardly sloping region 264 of the body 240 defined between the inner edge 260 and the trough 258 provides an orientation that inhibit particles and deposition material from traveling into the gap defined between the inner edge 260 and the substrate 104.

The outer wall 244 of the body 240 has a diameter selected such that the deposition ring 102 and cover ring 114 remain engaged through a wide range of processing temperatures. In the embodiment depicted in FIG. 2, the outer wall 244 has a diameter greater than an inside diameter of the wall 218 of the cover ring 114, and less than an inside diameter of the tapered section 214 of the cover ring 114.

A land 280 is formed between the outer wall 244 and the upper wall 246 to support the cover ring 114. The land 280 is generally horizontal and perpendicular to the centerline of the deposition ring 102. The land 280 is configured to support the ledge 216 of the cover ring 114. The land 280 is generally smooth and planar to allow the ledge 216 to slide along the land 280 as the rings 102, 114 self-align as they come into contact with each other.

An upper outer wall 252 is formed in the body 240 between the outer wall 244 and the upper wall 246. The upper wall 246 and upper outer wall 252 have dimensions selected such that the deposition ring 102 and the lip 204 of the cover ring 114 interleave in a spaced apart relation to define the labyrinth gap therebetween. In the embodiment depicted in FIG. 2, the upper outer wall 252 has a diameter greater than an inside diameter of the lip 204 of the cover ring 114, and less than a diameter of the wall 218 of the cover ring 114. The spacing between the upper outer wall 252 of the deposition ring 102 and the wall 218 of the cover ring 114 is selected to maintain a spaced apart relation between the rings 102, 114, even after the rings 102, 114 have been coated with about 1000 micrometers of material during substrate deposition processes.

A notch 254 is formed between the outer wall 244 and the upper outer wall 252. The notch 254 may share a wall with the surface of the land 280. The notch 254 provides an area for receiving material, disposed on the land 280 that is pushed by cover ring 114 as the ledge 216 of the cover ring 114 traverses across the land 280. As the material disposed on the land 280 may be moved into the notch 254 as the cover ring 114 moves relative to the deposition ring 102, the material disposed on the land 280 is less likely to be forced between the land 280 and the ledge 216, thereby enhancing the retention of the parallel relation of the rings 102, 114 over the course of processing many substrates. Moreover, by having an area for material to be received as the cover ring 114 moves relative to the deposition ring 102, the material disposed on the land 280 is less likely to prevent and/or limit the relative movement of the rings 102, 114. Moreover, as the notch 254 faces away from the plasma and trajectory of deposition material potentially traveling through the labyrinth gas, deposition build up and bridging between ports is less likely than conventional designs. As such, the orientation of the notch 254 extends the service life of the deposition ring 102.

The body 240 may also include a coating 270 which is at least one of resistant to plasma and/or promotes adhesion of deposited material. In the embodiment depicted in FIG. 2, the coating 270 may be the same as the coating 226. The coating 270 may be limited to the sloped region 264, the trough 258, sloped region 256, the upper wall 246 and the outer upper outer wall 252. The land 280, upon which the ledge 216 of the cover ring 114 is supported, is not coated to prevent shorting between the deposition ring 102 and the cover ring 114.

Figure 3:
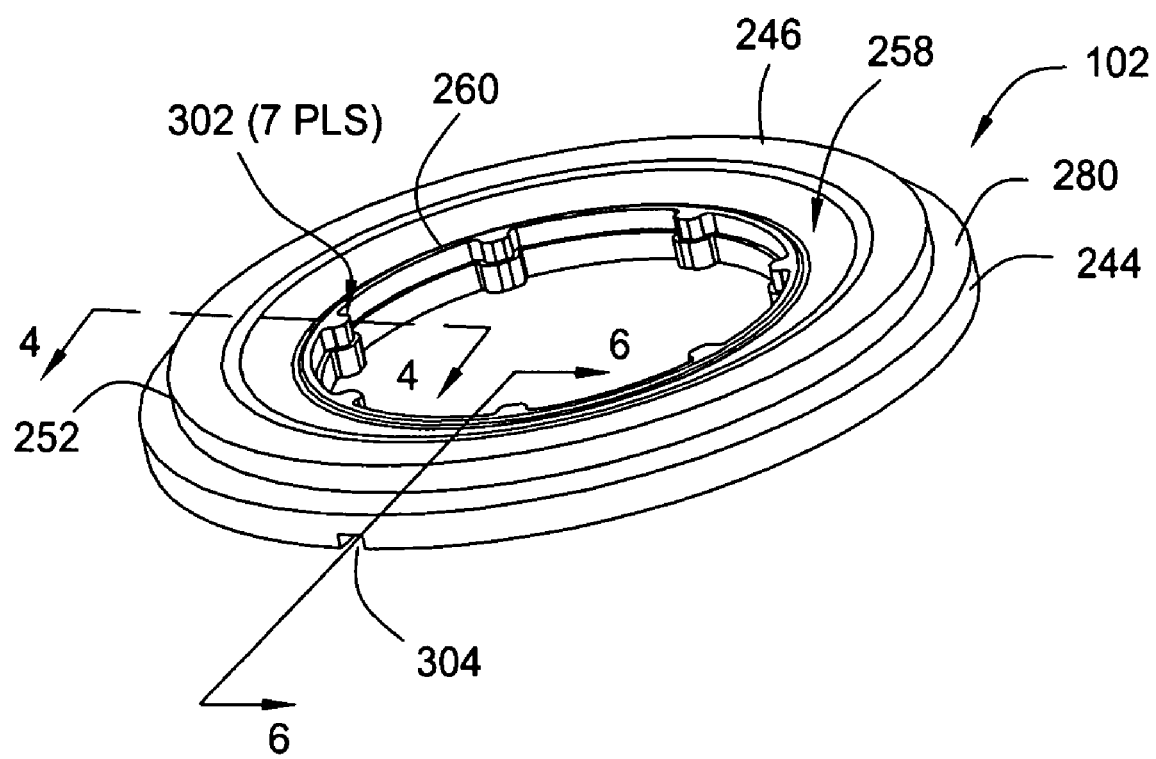
FIG. 3 is perspective view of the notched deposition ring of FIG. 1.
Figure 4:
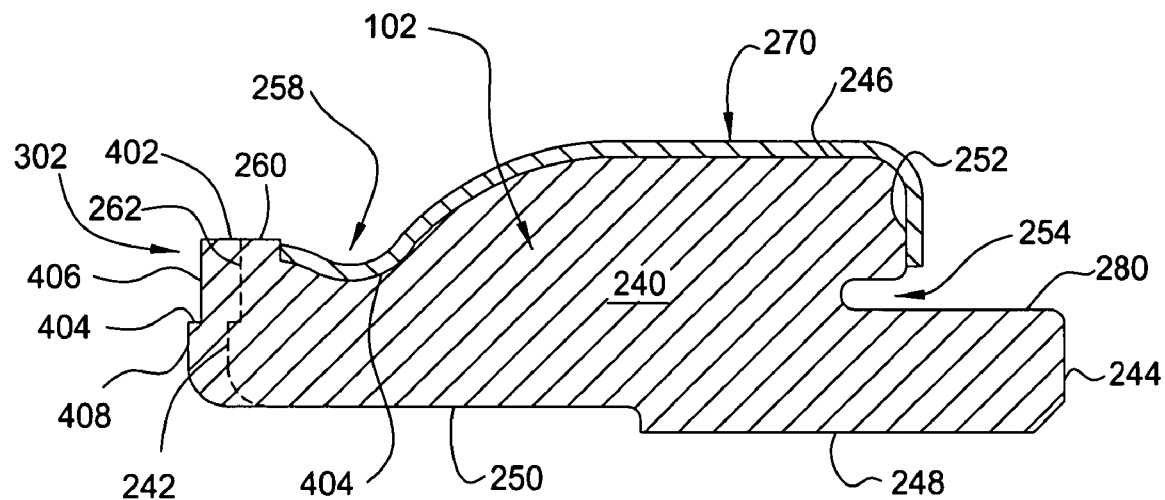
FIG. 4 is another a partial sectional view of the notched deposition ring taken along section line 4-4 of FIG. 3.
Figure 5:
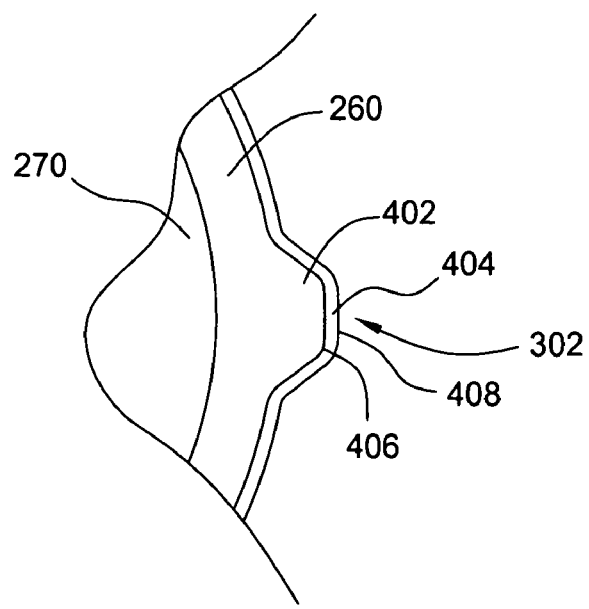
FIG. 5 is a partial top view of the deposition ring of FIG. 3.

FIG. 3 is a perspective view of the deposition ring 102 having at least one tab 302. FIG. 4 is a partial sectional view of the deposition ring 102 taken through section line 4-4 of FIG. 3. FIG. 5 is a partial top view of the deposition ring 102 illustrating a top of the tab 302. Referring now to FIGS. 3-5, the tab 302 extends from the top portion of the deposition ring 102 that is configured to underlie a notch of the substrate 104 when the substrate is positioned on the pedestal assembly 100. In the embodiment depicted in FIGS. 3-5, the tab 302 extends inward from the upper inner wall 262 such that a top 402 of the tab 302 is coplanar and forms a single surface with the inner edge 260. The tab 302 may also extend from the inner wall 242. In the embodiment depicted in FIG. 3, seven tabs 302 are provided.

The tab 302 includes an upper face 406 and a lower face 408. A ledge 404 formed between the faces 406, 408 is generally parallel to the inner edge 260. The aces 406, 408 respectively had a parallel orientation and form a continuous surface with the upper inner wall 262 and the inner wall 242. The surfaces forming the tab 302 are generally free from the coating 270.

The tab 302 in the deposition ring 102 advantageously provides an extension of the body that underlies a notch of the substrate 104. Thus, the tab 302 prevents deposition material from contacting the pedestal assembly 400 through the space created by the notch in the substrate. Moreover, as a plurality of tabs 302 are provided, greater flexibility of substrate orientation is afforded.

Figure 6:
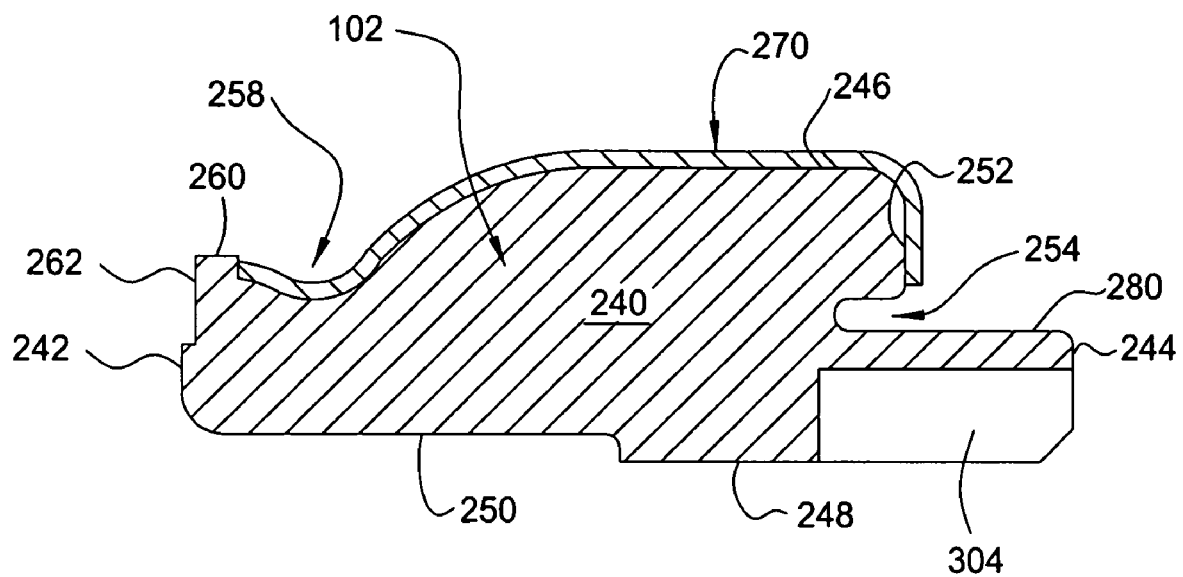
FIG. 6 is a partial sectional view of the notched deposition ring taken along section line 6-6 of FIG. 3.

In order to provide a measure of orientation of the deposition ring 102 within the chamber 105, a slot 304 is provided as shown in FIGS. 3 and 6. the slot 304 may be engaged with a feature (not shown) extending from at least one of the pedestal assembly 100 and/or shield 162. As the slot 304 facilitates maintaining the ring 102 and tabs 302 in a known orientation, the substrate may be provided in a complimentary orientation that ensures the notch of the substrate is aligned with one of the tabs 302 of the deposition ring 102.

Thus, a deposition ring has been provided that includes a notch formed in its outer surface. The notched deposition ring facilitates substrate deposition processes with reduced processing defects due to shorting and/or material bridging between the ring and substrate.

While the foregoing is directed to the preferred embodiment of the present invention, other and further embodiments of the invention may be devised without departing from the basic scope thereof, and the scope thereof is determined by the claims that follow.

What is claimed is:

1. A process kit, comprising:
    an annular deposition ring body comprising:
        an inner wall;
        an outer wall;
        an upper wall defining at least a portion of an upper surface of the body;
        a bottom wall;
        a trough recessed into an upper surface of the body between the upper wall and the inner wall; and
        at least one notch extending into the body and towards the inner wall.

2. The process kit of claim 1, wherein the body is fabricated from ceramic.

3. The process kit of claim 1, wherein the body further comprises:
    an arc spray coating.

4. The process kit of claim 1, wherein the body further comprises:
    a land formed between the outer wall and the upper wall; and
    a coating applied to at least the upper wall and the trough of the body to which tantalum and/or tantalum nitride adheres preferentially relative to a surface of the land.

5. The process kit of claim 1, wherein the body further comprises:
    a sloped portion coupling the trough to an inner edge of the upper surface.

6. The process kit of claim 5, wherein the body has a thickness at the inner edge greater than a thickness of the body at the trough, and less than a thickness of the body at the upper wall.

7. The process kit of claim 1, wherein the body further comprising:
    an upper outer wall recessed from the outer wall and defined on an outer surface of the body, the upper outer wall disposed between the outer wall and the upper wall.

8. A process kit, comprising:
    an annular deposition ring body comprising:
        an inner wall;
        an outer wall;
        an upper wall defining at least a portion of an upper surface of the body;
        a bottom wall;
        a trough recessed into an upper surface of the body between the upper wall and the inner wall;
        at least one notch extending into the body;
        an upper outer wall recessed from the outer wall and defined on an outer surface of the body, the upper outer wall disposed between the outer wall and the upper wall; and
    an undercut formed between the upper outer wall and the outer wall.

9. The process kit of claim 8, wherein the body further comprising:
    a land having an orientation perpendicular to a centerline of the body and formed between the upper outer wall and the outer wall, wherein the land and the undercut have coplanar surfaces.

10. The process kit of claim 1, wherein the notch extends from an inner portion of the upper surface of the body.

11. The process kit of claim 1, wherein seven notches extend radially inward from the inner wall of the body.

12. The process kit of claim 9 further comprising:
    a cover ring body comprising:
        a lip extending inward over a portion of the deposition ring body in a spaced apart relation;
        an inner ring and an outer ring defining a slot having a downwardly facing open end; and
        a ledge defined inward of the inner ring and supported by the land of the deposition ring.

13. The process kit of claim 12, wherein the cover ring body is at least partially coated with an arc spray coating.

14. A process kit, comprising:
    an annular deposition ring body comprising:
        an inner wall;
        an outer wall;
        a land orientated substantially perpendicular to a centerline of the body and formed proximate the outer wall, the land adapted to support a cover ring body thereon;
        an upper wall defining at least a portion of an upper surface of the body;
        a bottom wall; and
        a notch extending inward from an inner edge of the upper surface of the body and having a surface coplanar with the land.

15. The process kit of claim 14 further comprising:
    a trough recessed into an upper surface of the body between the upper wall and the inner wall; and
    a recessed surface formed on a lower surface of the body between the bottom wall and the inner wall.

16. The process kit of claim 15, wherein the notch further comprises:
    a horizontal orientation.

17. The process kit of claim 14, wherein the body is partially coated by an arc spray coating.

18. The process kit of claim 14, wherein the body further comprises:
    a sloped portion coupling the trough to the inner edge of the upper surface.

19. The process kit of claim 14, wherein the body further comprising:
    an upper outer wall defined on an outer surface of the body and disposed concentrically inward of the outer wall.

20. The process kit of claim 14, wherein the body further comprising:
   a land orientated substantially perpendicular to the centerline of the body, the land formed between the recessed portion and the outer wall.

21. The process kit of claim 14 further comprising:
   a cover ring body comprising:
      a lip extending inward over a portion of the deposition ring body in a spaced apart relation;
      an inner ring and an outer ring defining a slot having a downwardly facing open end; and
      a ledge defined inward of the inner ring and supported by the land of the deposition ring.

22. The process kit of claim 21, wherein the cover ring body is at least partially coated with an arc spray coating.

23. A process kit comprising:
   an annular deposition ring body comprising:
      an upper wall forming a portion of an upper surface of the body;
      a lower wall forming a portion of a lower surface of the body;
      an inner wall;
      an upper inner wall disposed adjacent to and having a diameter greater than the inner wall;
      an outer wall;
      an upper outer wall disposed adjacent to and having a diameter less than the outer wall;
      a land substantially perpendicular to a centerline of the body formed between the outer wall and upper outer wall;
      a notch formed in the body between the outer wall and upper outer wall;
      a trough recessed into the upper surface of the body between the upper wall and the inner wall;
      a sloped portion extending upwards from the trough to an inner edge of the upper surface;
      a tab extending inward from the inner edge of the upper surface and the upper inner wall;
      a recessed surface formed on the lower surface of the body between the bottom wall and the inner wall; and
      a coating applied to at least the upper wall and the trough of the body to which tantalum and/or tantalum nitride adheres preferentially relative to a surface of the land.

* * * * *

UNITED STATES PATENT AND TRADEMARK OFFICE
CERTIFICATE OF CORRECTION

PATENT NO. : 7,520,969 B2 Page 1 of 1
APPLICATION NO. : 11/369884
DATED : April 21, 2009
INVENTOR(S) : Keith A. Miller It is certified that error appears in the above-identified patent and that said Letters Patent is hereby corrected as shown below:

Column 7, Line 3, delete "aces" and insert --faces-- therefor.

Signed and Sealed this

Fourteenth Day of July, 2009

JOHN DOLL
*Acting Director of the United States Patent and Trademark Office*